United States Patent
Itasaka et al.

(10) Patent No.: US 9,621,106 B2
(45) Date of Patent: Apr. 11, 2017

(54) OSCILLATION CIRCUIT, OSCILLATOR, ELECTRONIC APPARATUS AND MOVING OBJECT

(71) Applicant: SEIKO EPSON CORPORATION, Tokyo (JP)

(72) Inventors: Yosuke Itasaka, Tatsuno-machi (JP); Noboru Itomi, Minowa-machi (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/013,314

(22) Filed: Feb. 2, 2016

(65) Prior Publication Data

US 2016/0241190 A1 Aug. 18, 2016

(30) Foreign Application Priority Data

Feb. 16, 2015 (JP) .................................. 2015-027769

(51) Int. Cl.
*H03B 5/36* (2006.01)

(52) U.S. Cl.
CPC ............... *H03B 5/364* (2013.01); *H03B 5/36* (2013.01)

(58) Field of Classification Search
CPC .................................. H03B 5/36; H03B 5/364
USPC ..................... 331/116 FE, 116 R, 154, 158
See application file for complete search history.

(56) References Cited

U.S. PATENT DOCUMENTS

| 2006/0244546 A1* | 11/2006 | Yamamoto | H03B 5/04 331/158 |
| 2009/0051447 A1* | 2/2009 | McCracken | H03B 5/04 331/70 |

FOREIGN PATENT DOCUMENTS

JP 2007-067967 A 3/2007

* cited by examiner

*Primary Examiner* — Richard Tan
(74) *Attorney, Agent, or Firm* — Oliff PLC

(57) ABSTRACT

An oscillation circuit includes a circuit for oscillation that oscillates a resonator, an output circuit that has a signal, output from the circuit for oscillation, input thereto to thereby output an oscillation signal, a connection terminal to which power is applied, a first wiring that connects from the connection terminal to the output circuit, and a second wiring that is connected to the first wiring through a connection node provided on the first wiring and connects from the connection node to the circuit for oscillation. The circuit for oscillation, the output circuit, the connection terminal, the first wiring, and the second wiring are provided on a semiconductor substrate. The length of a wiring extending from the connection terminal of the first wiring to the connection node is shorter than the length of the second wiring.

13 Claims, 9 Drawing Sheets

OSCILLATION CIRCUIT, OSCILLATOR, ELECTRONIC APPARATUS AND MOVING OBJECT

BACKGROUND

1. Technical Field

The present invention relates to an oscillation circuit, an oscillator, an electronic apparatus, and a moving object.

2. Related Art

An AT-cut quartz crystal resonator constituting a temperature compensated crystal oscillator (TCXO) has a frequency fluctuating while drawing a curve approximated by a cubic curve, with the vicinity of 25 degrees as an inflection point, due to a variation in ambient temperature. In addition, since an oscillation circuit constituting an oscillator, or the like has temperature characteristics, a frequency also fluctuates by the effects. In the TCXO, a voltage signal for compensating for the frequency fluctuation is generated by a temperature compensation circuit and is applied to a varicap diode provided in an oscillation circuit, and thus a frequency fluctuation with respect to changes in ambient temperature is suppressed, thereby realizing a high level of frequency accuracy.

As an example of such a TCXO, JP-A-2007-67967 discloses a configuration of a TCXO, using a semiconductor substrate, which includes an oscillation circuit, an output buffer circuit, and a temperature sensor circuit. In the configuration, the output buffer circuit and the temperature sensor circuit are disposed at corners on a diagonal line of the semiconductor substrate or corners on the same side.

In the TCXO as disclosed in JP-A-2007-67967, wirings (power supply wiring and ground wiring) for supplying power to the output circuit having one heat source and the oscillation circuit are generally communized. In addition, a wiring for supplying power is generally thicker than other wirings, that is, has low resistance. For this reason, heat generated from the output circuit having one heat source is transferred to another circuit through a wiring for supplying power, for example, the oscillation circuit, and thus there is the possibility of an output frequency fluctuating.

SUMMARY

An advantage of some aspects of the invention is to provide an oscillation circuit, an oscillator, an electronic apparatus, and a moving object which are capable of reducing a frequency fluctuation.

The invention can be implemented as the following forms or application examples.

Application Example 1

An oscillation circuit according to this application example includes a circuit for oscillation that is connected to a resonator and oscillates the resonator, an output circuit that has a signal, output from the circuit for oscillation, input thereto to thereby output an oscillation signal, a pad to which power is applied, a first wiring that connects from the pad to the output circuit, and a second wiring that is connected to the first wiring through a connection node provided on the first wiring and connects from the connection node to the circuit for oscillation. The circuit for oscillation, the output circuit, the pad, the first wiring, and the second wiring are provided on a semiconductor substrate. A length of a wiring extending from the pad of the first wiring to the connection node is shorter than a length of the second wiring.

According to this application example, heat generated by the output circuit is radiated to the outside through the first wiring and the pad, and thus it is possible to reduce the transfer of heat to the circuit for oscillation through the first wiring and the second wiring. Therefore, it is possible to realize the oscillation circuit capable of reducing a frequency fluctuation, for example, in a case where an oscillator is configured.

Application Example 2

In the oscillation circuit according to the application example, the length of the wiring extending from the pad of the first wiring to the connection node may be shorter than a length of a wiring extending from the output circuit of the first wiring to the connection node.

According to this application example, the length of the wiring extending from the output circuit of the first wiring to the connection node is long, and thus heat is radiated to a space from the wiring. Thereby, it is possible to reduce the transfer of heat generated by the output circuit to the circuit for oscillation through the first wiring and the second wiring. Therefore, it is possible to realize the oscillation circuit capable of reducing a frequency fluctuation, for example, in a case where an oscillator is configured.

Application Example 3

In the oscillation circuit according to the application example, the first wiring may have low-pass filter characteristics.

According to this application example, it is possible to reduce the transfer of high frequency noise generated by the output circuit to the circuit for oscillation through the first wiring and the second wiring. Therefore, it is possible to realize the oscillation circuit with high operation reliability.

Application Example 4

In the oscillation circuit according to the application example, the first wiring may have a first region and a second region which are separated from each other between the output circuit and the connection node. The oscillation circuit may further include an electronic element that electrically connects the first region and the second region.

The electronic element is, for example, an inductor or a resistor.

According to this application example, the first wiring is separated, and thus it is possible to reduce the transfer of heat. In addition, it is possible to radiate heat to a space through the electronic element. Therefore, it is possible to realize the oscillation circuit capable of reducing a frequency fluctuation, for example, in a case where an oscillator is configured.

Application Example 5

An oscillator according to this application example includes the oscillation circuit according to any one of the above-described application examples, the resonator, and a container that accommodates the oscillation circuit and the resonator.

According to this application example, heat generated by the output circuit is radiated to the outside through the first wiring and the pad, and thus it is possible to reduce the transfer of heat to the circuit for oscillation through the first wiring and the second wiring. Therefore, it is possible to realize the oscillator capable of reducing a frequency fluctuation.

Application Example 6

An electronic apparatus according to this application example includes the oscillation circuit according to any one of the above-described application examples.

Application Example 7

A moving object according to this application example includes the oscillation circuit according to any one of the above-described application examples.

According to these application examples, the oscillation circuit capable of reducing a frequency fluctuation in a case where an oscillator is configured is used, and thus it is possible to realize the electronic apparatus and the moving object which have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail with reference the accompanying drawings. The drawings are used for convenience of description. Meanwhile, the embodiments described below are not unduly limited to the disclosure of the invention described in the appended claims. In addition, all the configurations described below are not necessarily essential components of the invention.

1. Oscillation Circuit 1-1. Circuit Configuration

Figure 1:
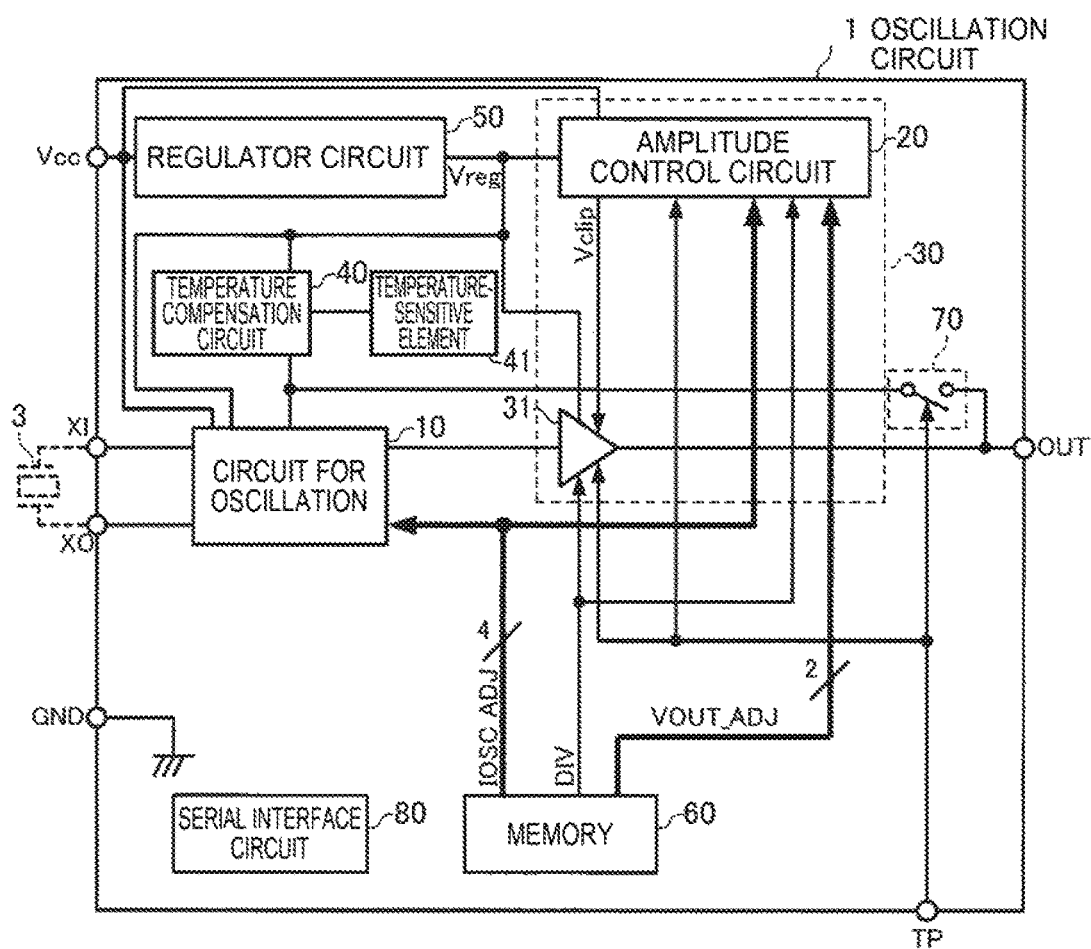
FIG. 1 is a circuit diagram of an oscillation circuit according to the present embodiment.

FIG. 1 is a circuit diagram of an oscillation circuit 1 according to the present embodiment. As illustrated in FIG. 1, the oscillation circuit 1 according to the present embodiment is connected to a resonator 3 and serves as a temperature-compensated oscillator.

In the present embodiment, the resonator 3 is a quartz crystal resonator using quartz crystal as a substrate material, and examples of the resonator to be used include an AT-cut quartz crystal resonator, an SC-cut quartz crystal resonator, and a tuning fork type quartz crystal resonator. The resonator 3 may be a surface acoustic wave (SAW) resonator or a micro electro mechanical systems (MEMS) resonator. In addition, examples of a substrate material of the resonator 3 include a piezoelectric material such as piezoelectric single crystal, such as quartz crystal, lithium tantalate or lithium niobate, or piezoelectric ceramics such as lead zirconate titanate, a silicon semiconductor material, and the like. As excitation means of the resonator 3, means using a piezoelectric effect may be used, or electrostatic driving using Coulomb force may be used. Meanwhile, the resonator 3 of the present embodiment is configured as a chip-shaped element having an individualized substrate material. However, the invention is not limited thereto, and a resonation device in which a chip-shaped element is sealed in a container may be used.

In the present embodiment, the oscillation circuit 1 is configured to include a circuit for oscillation 10, an output circuit 30, a temperature compensation circuit 40 (example of a "characteristic adjusting circuit"), a temperature-sensitive element 41, a regulator circuit 50, a memory 60, a switch circuit 70, and a serial interface (I/F) circuit 80 on a semiconductor substrate. In addition, in the oscillation circuit 1, a terminal Vcc (example of a first "pad" to which power is applied) which is a power supply terminal, a terminal GND (example of a second "pad" to which power is applied) which is a ground terminal, a terminal OUT which is an output terminal, a terminal TP which is a test terminal or a terminal to which a signal for controlling the oscillation circuit 1 is input, and terminals XI and XO which are terminals for connection to the resonator 3 are provided on the semiconductor substrate. The terminal Vcc, the terminal GND, the terminal. OUT, and the terminal TP are also connected to an external terminal (not shown) of an oscillator. Meanwhile, the oscillation circuit 1 of the present embodiment may have a configuration in which some of the components are omitted or changed, or may have a configuration in which other components are added.

The circuit for oscillation 10, which is a circuit connected to the resonator 3 and oscillating the resonator 3, amplifies an output signal of the resonator 3 and feeds back the amplified signal to the resonator 3. The circuit for oscillation 10 outputs an oscillation signal based on the oscillation of the resonator 3.

The temperature compensation circuit 40 generates a temperature compensation voltage according to frequency temperature characteristics of the resonator 3 with a temperature as a variable in response to a signal which is output from the temperature-sensitive element 41 so that an oscillation frequency of the circuit for oscillation 10 becomes constant irrespective of temperature. The temperature compensation voltage is applied to one end of a variable capacitance element (not shown) which functions as a load capacitance of the circuit for oscillation 10, and thus an oscillation frequency is controlled.

A signal generation circuit 31 of the output circuit 30 has an oscillation signal input from the circuit for oscillation 10, and generates and outputs an oscillation signal for external output.

An amplitude control circuit 20 of the output circuit 30 is a circuit for controlling the amplitude of an oscillation signal which is output by the signal generation circuit 31. The amplitude control circuit 20 includes an amplitude control unit that controls the amplitude of an oscillation signal which is output by the signal generation circuit 31, and a heating unit. As described later, the heating unit is configured such that a direct current to be input is controlled on the basis of operation states of the circuit for oscillation 10 and the amplitude control unit of the amplitude control circuit 20.

The regulator circuit 50 generates power voltages of the circuit for oscillation 10, the temperature compensation circuit 40, and the output circuit 30 or a constant output voltage Vreg serving as a reference voltage, on the basis of a power voltage supplied from the terminal Vcc.

The memory 60 includes a non-volatile memory and a resistor which are not shown in the drawing, and is configured to be able to perform reading and writing on the non-volatile memory or the resistor through the serial interface circuit 80 from an external terminal. In the present embodiment, since there are only four terminals Vcc, GND, OUT, and TP of the oscillation circuit 1 which are connected to an external terminal in a case where an oscillator is configured, the serial interface circuit 80 may be configured to receive a clock signal SCLK which is externally input from the terminal TP and a data signal DATA which is externally input from the terminal OUT, for example, when a voltage of the terminal Vcc is higher than a threshold value and to read and write data from and in a non-volatile memory or an internal resistor which is not shown in the drawing. The memory 60 may store data for controlling at least one of the circuit for oscillation 10, the output circuit 30, and the characteristic adjusting circuit (temperature compensation circuit 40). Thereby, it is possible to realize the oscillation circuit 1 capable of easily controlling at least one of the circuit for oscillation 10, the output circuit 30, and the characteristic adjusting circuit (temperature compensation circuit 40).

The switch circuit 70 is a circuit for switching electrical connection between the temperature compensation circuit 40 and the terminal OUT which is electrically connected to an output side of the output circuit 30.

In the present embodiment, when a signal which is input to the terminal TP is in a low level (example of a first mode), the switch circuit 70 is controlled so as not to electrically connect the temperature compensation circuit 40 and the terminal OUT, and an oscillation signal which is output from the output circuit 30 is output to the terminal OUT. In addition, as described later, when a signal which is input to the terminal TP is in a low level, the operation of the heating unit of the amplitude control circuit 20 is stopped.

On the other hand, when a signal which is input to the terminal TP is in a high level (example of a second mode), the switch circuit 70 is controlled so as to electrically connect the temperature compensation circuit 40 and the terminal OUT, the output of an oscillation signal from the output circuit 30 is stopped, and an output signal (temperature compensation voltage) of the temperature compensation circuit 40 is output to the terminal OUT. In addition, as described later, when a signal which is input to the terminal TP is in a high level, the heating unit of the amplitude control circuit 20 is configured such that a direct current to be input is controlled on the basis of operation states of the circuit for oscillation 10 and the amplitude control unit of the amplitude control circuit 20.

In a case of being used as a TCXO for GPS which is used in a cellular or the like, a high frequency temperature compensation accuracy of, for example, ±0.5 ppm is required. Consequently, in the present embodiment, the regulator circuit 50 stabilizes an output voltage amplitude of the output circuit 30, and the output circuit 30 outputs a clipped sine waveform having a suppressed output amplitude, from a point of view of low current consumption. In the present embodiment, an output amplitude of the output circuit 30 can be adjusted in a range of, for example, 0.8 Vpp to 1.2 Vpp by the amplitude control circuit 20, and a configuration is adopted in which a heating circuit having a size smaller than that of a circuit of the related art is built in the amplitude control circuit 20. In addition, in the present embodiment, the memory 60 is provided with an oscillation stage current adjusting resistor IOSC_ADJ (data for controlling the circuit for oscillation 10) for adjusting and selecting an oscillation stage current of the circuit for oscillation 10 depending on the frequency of the resonator 3, a frequency dividing and switching resistor DIV (data for controlling the output circuit 30) for selecting whether to frequency-divide an oscillation signal by a frequency dividing circuit provided inside the output circuit 30 and to output the frequency-divided signal, and an output level adjusting resistor VOUT_ADJ (data for controlling the amplitude control circuit 20) for adjusting an amplitude level of an oscillation signal having clipped sine waves which is output by the output circuit 30, and the amount of current flowing into the heating circuit inside the amplitude control circuit 20 is controlled in association with a setting state based on the data stored in the resistors.

Meanwhile, setting values of the resistors are stored in the non-volatile memory included in the memory 60, for example, during the manufacture of the oscillation circuit 1, and a setting value is written in each resistor from the non-volatile memory at the time of supplying power after the assembling of an oscillator. In addition, temperature compensation data (constant, linear, and cubic coefficient values according to frequency temperature characteristics of the resonator 3 (quartic and quantic coefficient values may also be included), a table showing correspondence between temperature and temperature compensation voltages, or the like) which is input to the temperature compensation circuit 40 (data for controlling the temperature compensation circuit 40) is also stored in the non-volatile memory, for example, during the manufacture of the oscillation circuit 1.

Configuration of Circuit for Oscillation

Figure 2:
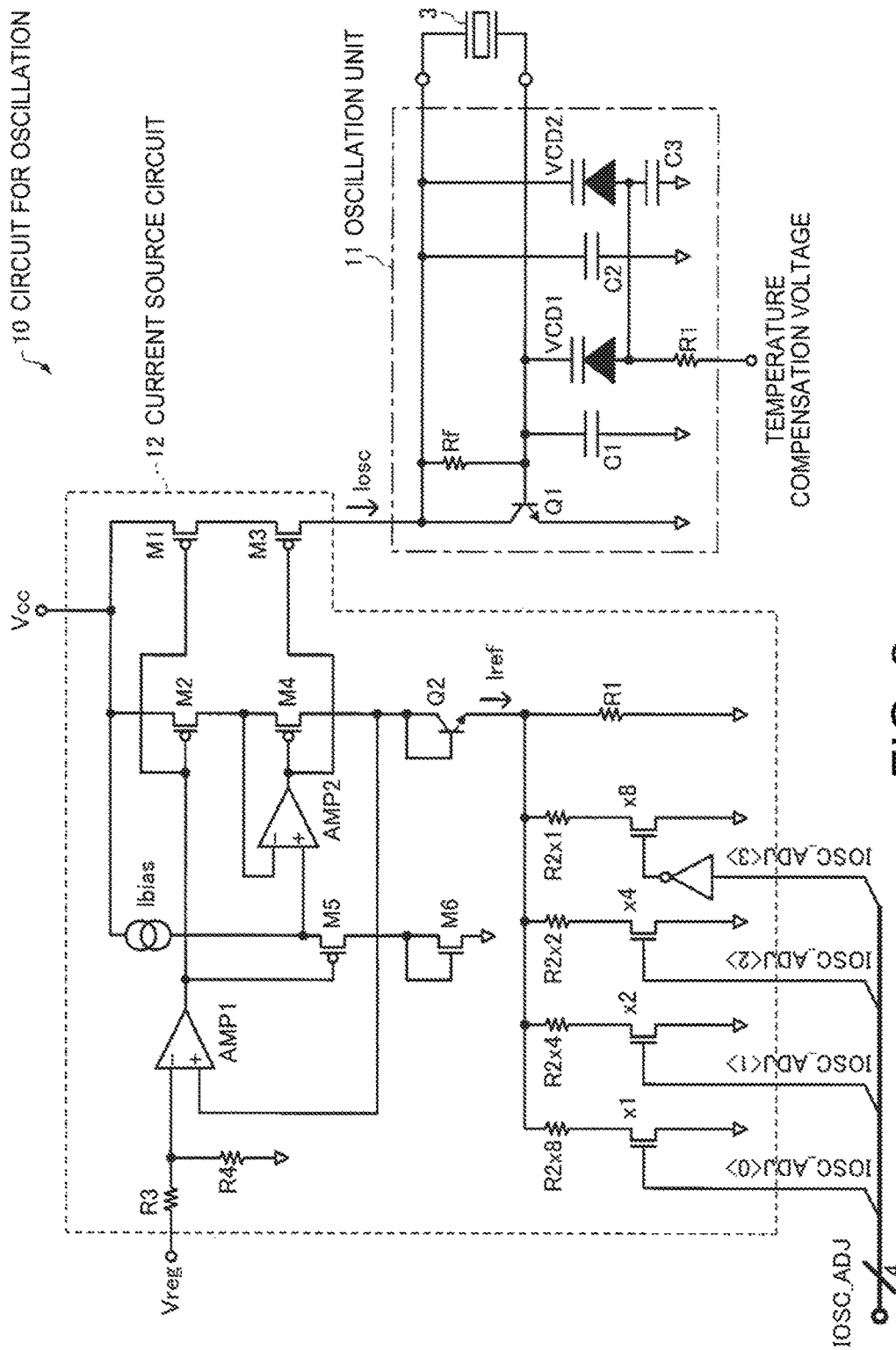
FIG. 2 is a circuit diagram of a circuit for oscillation.

FIG. 2 is a circuit diagram of the circuit for oscillation 10 of FIG. 1. As illustrated in FIG. 2, the circuit for oscillation 10 includes an oscillation unit 11 and a current source circuit 12. The oscillation unit 11 is connected to the resonator 3 to thereby constitute a pierced oscillation circuit. In the oscillation unit 11, varicap diodes VCD1 and VCD2 which are parallel variable capacitance elements are connected to the resonator 3 in series, and a capacitance value of the oscillation unit 11 varies depending on temperature by temperature compensation voltages applied to the varicap diodes VCD1 and VCD2, and thus an oscillation signal having compensated frequency temperature characteristics of the resonator 3 is output.

The current source circuit 12 generates a current Iref serving as a reference of an oscillation stage current Iosc by a current adjusting unit in which a differential amplifier AMP1, a PMOS transistor M2, a bipolar transistor Q2, and a resistor R1 are connected to a plurality of resistors R2 in parallel. The current Iref is adjusted by 4-bit IOSC_ADJ setting values. The size of a gate width of a PMOS transistor M1 and the size of a gate width of the PMOS transistor M2 have a ratio of, for example, 10:1. The size of a gate width of a PMOS transistor M3 and the size of a gate width of a PMOS transistor M4 have the same size ratio. For example, when Iref=20 µA, 200 µA which is ten times the value is supplied to the oscillation unit 11 as an oscillation stage current. A circuit constituted by a differential amplifier AMP2, the PMOS transistor M4, a current source flowing through a bias current Ibias, and PMOS transistors M5 and M6 is a circuit for further suppressing the dependence of the oscillation stage current Iosc, flowing to the PMOS transistors M1 and M3 connected to a cascade, on a power supply. The circuit is a gain enhancing cascode circuit in which the dependence of a current, which is output by a current source, on a power supply in a TCXO required to have a high level of frequency accuracy is reduced more than in a cascode circuit. In the cascode circuit, a source voltage of the PMOS transistor M4 on the reference side is monitored, and gate voltages of the PMOS transistors M3 and M4 are controlled by the differential amplifier AMP2 when a power voltage (voltage of the terminal Vcc) fluctuates, thereby further suppressing a variation in a potential difference between a source and a drain of each of the PMOS transistors M1 and M2. An output resistance of the current source circuit 12 further increases by a multiple of the gain of the differential amplifier AMP2. The oscillation stage current Iosc is stabilized with respect to a fluctuation in a power voltage, and thus an oscillation frequency fluctuation of the oscillation unit 11 is suppressed.

Configuration of Output Circuit

Figure 3:
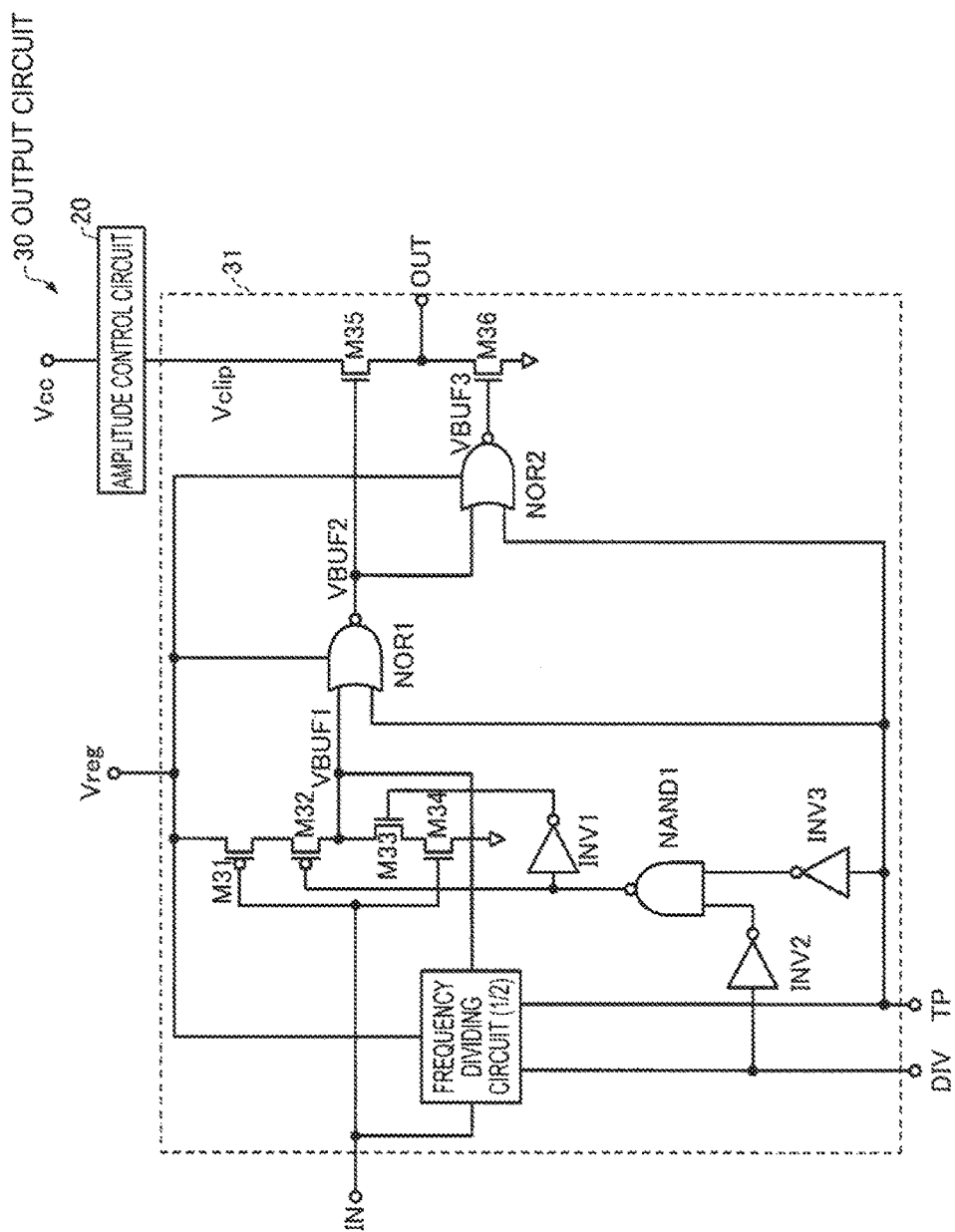
FIG. 3 is a circuit diagram of an output circuit.

FIG. 3 is a circuit diagram of the output circuit 30 of FIG. 1. As illustrated in FIG. 3, in the output circuit 30, the output voltage Vreg of the regulator circuit 50 is applied to a terminal Vreg, and a clip voltage Vclip for obtaining a clipped sine wave output generated by the amplitude control circuit 20 is applied to a terminal Vclip. The output circuit 30 includes a frequency dividing circuit, and is configured to be able to select whether to divide the frequency of a signal (oscillation signal which is output by the circuit for oscillation 10) which is input to a terminal IN into two by a voltage level of a terminal DIV. In the present embodiment, when a setting value of the frequency dividing and switching resistor DIV is 0, the terminal DIV is set to be in a low level, and an input signal has a polarity inverted by an inverter constituted by MOS transistors M31 to M34 without being subjected to frequency-division, and a signal of a node VBUF1 is transmitted to a NOR circuit NOR1. On the other hand, when a setting value of the frequency dividing and switching resistor DIV is 1, the terminal DIV is set to be in a high level, an input signal is subjected to ½ frequency-division by the frequency dividing circuit, and a signal of the node VBUF1 is transmitted to the NOR circuit NOR1.

In addition, the output circuit 30 is set to be in an operable state when the terminal TP is in a low level, and is set to be in an operation stop state when the terminal TP is in a high level. During a normal operation, the terminal TP is set to be in a low level, and an input signal from the input terminal IN is clipped at a voltage amplitude level which is determined by Vclip and is output from the terminal OUT. When the temperature compensation circuit 40 of FIG. 1 is adjusted (tested), the terminal TP is set to be in a high level, the MOS transistors M32 and M33 are turned off, and thus both an output node VBUF2 of the NOR circuit NOR1 and an output node VBUF3 of a NOR circuit NOR2 are set to be in a ground potential state, and both NMOS transistors M35 and M36 are set to be in an off-state. Thereby, the output circuit 30 is set to be in an operation stop state.

Since a larger amount of current flows to the NMOS transistors M35 and M36 than that flowing to other transistors, the NMOS transistors M35 and M36 may serve as chief heat sources of the output circuit 30.

Configuration of Amplitude Control Circuit

Figure 4:
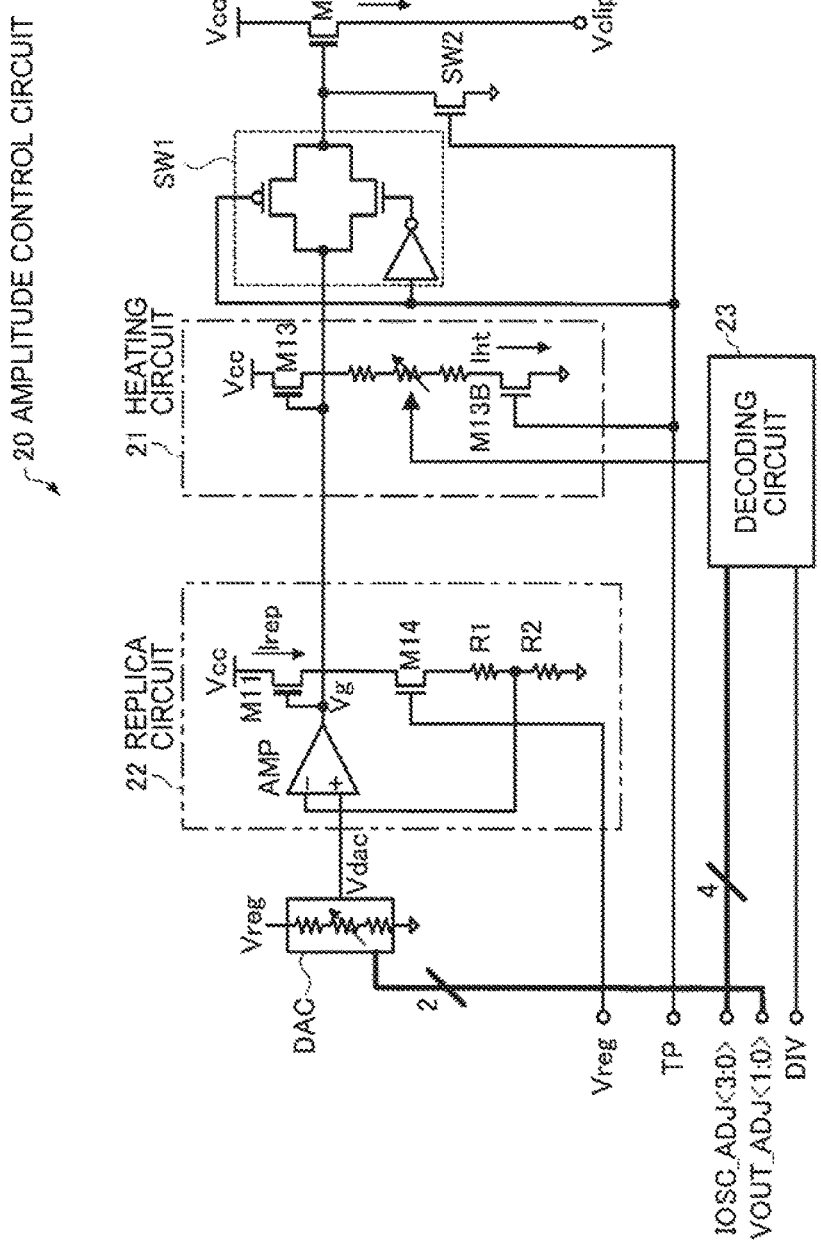
FIG. 4 is a circuit diagram of an amplitude control circuit.

FIG. 4 is a circuit diagram of the amplitude control circuit 20. In FIG. 4, NMOS transistors M11, M12, and M13 are depletion type MOS transistors, and other MOS transistors are normal type (enhancement type) MOS transistors. The amplitude control circuit 20 illustrated in FIG. 4 applies a static current (direct current) Iht during the adjustment of the temperature compensation circuit 40 to thereby generate heat equivalent to heat generated by the output circuit 30 during a normal operation. Thereby, a fluctuation in a heating value between during a normal operation and during the adjustment of the temperature compensation circuit 40 is suppressed.

As expressed as the following Expression (1), a clip voltage Vclip for determining an output amplitude level of the output circuit 30 is a voltage obtained by subtracting a voltage VgsM12 between a gate and a source of the NMOS transistor M12 from an output voltage Vg of a differential amplifier AMP.

$$V\text{clip} = Vg - Vgs_{M12} \qquad (1)$$

Here, Vg is obtained from an analog output voltage Vdac having been subjected to D/A conversion by a D/A converter DAC by the following Expression (2) on the basis of data given by the output level adjusting resistor VOUT_ADJ.

$$Vg = Vdac \cdot \left(\frac{R1}{R2} + 1\right) + Vgs_{M11} \qquad (2)$$

The relation of the following Expression (3) is established by substituting Expression (2) into Expression (1). That is, the clip voltage Vclip is determined by Vdac·(R1/R2+1) which is a voltage obtained by amplifying the output voltage Vdac of the D/A converter DAC by the differential amplifier AMP.

$$V\text{clip} + Vgs_{M12} = Vdac \cdot \left(\frac{R1}{R2} + 1\right) + Vgs_{M11} \qquad (3)$$

During a normal operation, the terminal TP is set to be in a low level, a switch circuit SW1 is set to be in an on-state, an NMOS switch SW2 is set to be in an off-state, a MOS transistor M13B is set to be in an off-state, and a heating circuit 21 is set to be in an operation stop state. On the other hand, during the adjustment of the temperature compensation circuit 40, the terminal TP is set to be in a high level, the switch circuit SW1 is set to be in an off-state, and the NMOS switch SW2 is set to be in an on-state. Thereby, the NMOS transistor M12 is set to be in a cut-off state, and the heating circuit 21 including the NMOS transistor M13 is set to be in an operation state.

1-2. Layout Configuration 1-2-1. First Specific Example

Figure 5:
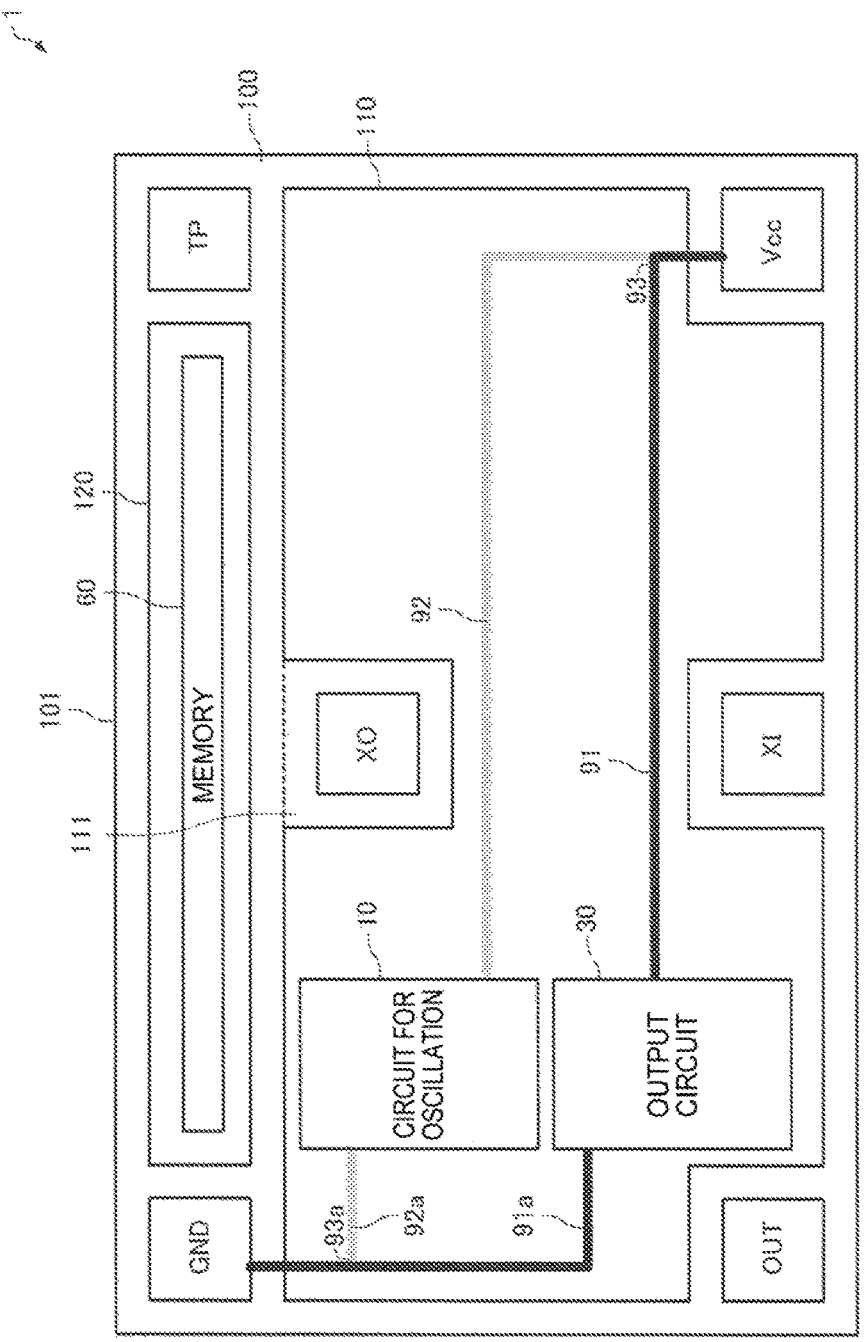
FIG. 5 is a schematic plan view illustrating a layout configuration of an oscillation circuit according to a first specific example.

FIG. 5 is a schematic plan view illustrating a layout configuration of an oscillation circuit 1 according to a first specific example. Meanwhile, in FIG. 5, some of circuits included in the oscillation circuit 1 are not described.

The oscillation circuit 1 according to the present specific example is configured to include a semiconductor substrate 100, a first circuit block 110, disposed on the semiconductor substrate 100, which includes at least a circuit for oscillation 10 and an output circuit 30 as components, and a second circuit block 120, disposed on the semiconductor substrate 100, which includes at least a memory 60 as a component.

In addition, the oscillation circuit 1 according to the present embodiment is configured to include a connection terminal XI, a connection terminal XO, a connection terminal Vcc (first "pad"), a connection terminal GND (second "pad"), a connection terminal OUT, and a connection terminal TP which correspond to the respective terminals illustrated in FIG. 1.

The oscillation circuit 1 according to the present specific example includes a first wiring 91 that electrically connects from the connection terminal Vcc to the output circuit 30, and a second wiring 92 that is electrically connected to the first wiring 91 through a connection node 93 provided on the first wiring 91 and connects from the connection node 93 to the circuit for oscillation 10. In addition, the oscillation circuit 1 according to the present specific example includes a first wiring 91*a* that electrically connects from the connection terminal GND to the output circuit 30, and a second wiring 92*a* that is electrically connected to the first wiring 91*a* through a connection node 93*a* provided on the first wiring 91*a* and connects from the connection node 93*a* to the circuit for oscillation 10.

As illustrated in FIG. 5, in the present specific example, the length (path length) of the first wiring 91 extending from the connection terminal Vcc to the connection node 93 is shorter than the length (path length) of the second wiring 92. In addition, the length (path length) of the first wiring 91*a* extending from the connection terminal GND to the connection node 93*a* is shorter than the length (path length) of the second wiring 92*a*.

According to the present specific example, heat generated by the output circuit 30 is radiated to the outside through the first wiring 91 and the connection terminal Vcc, and thus it is possible to reduce the heat transferred to the circuit for oscillation 10 through the first wiring 91 and the second wiring 92. Similarly, heat generated by the output circuit 30 is radiated to the outside through the first wiring 91*a* and the connection terminal GND, and thus it is possible to reduce the heat transferred to the circuit for oscillation 10 through the first wiring 91*a* and the second wiring 92*a*. Therefore, it is possible to realize the oscillation circuit 1 capable of reducing a frequency fluctuation, for example, in a case where an oscillator is configured.

In an example illustrated in FIG. 5, the length (path length) of the first wiring 91 extending from the connection terminal Vcc to the connection node 93 is shorter than the length (path length) of the first wiring 91 extending from the output circuit 30 to the connection node 93. In addition, the length (path length) of the first wiring 91*a* extending from the connection terminal GND to the connection node 93*a* is shorter than the length (path length) of the first wiring 91*a* extending from the output circuit 30 to the connection node 93*a*.

According to the present specific example, since the length of the first wiring 91 extending from the output circuit 30 to the connection node 93 is long, heat is radiated to a space from the wiring. Thereby, it is possible to reduce the transfer of heat generated by the output circuit 30 to the circuit for oscillation 10 through the first wiring 91 and the second wiring 92. Similarly, since the length of the first wiring 91*a* extending from the output circuit 30 to the connection node 93*a* is long, heat is radiated to a space from the wiring. Thereby, it is possible to reduce the transfer of heat generated by the output circuit 30 to the circuit for oscillation 10 through the first wiring 91*a* and the second wiring 92*a*. Therefore, it is possible to realize the oscillation circuit 1 capable of reducing a frequency fluctuation, for example, in a case where an oscillator is configured.

In the example illustrated in FIG. 5, the first wiring 91 and the first wiring 91*a* have low-pass filter characteristics. This is because the first wiring 91 and the first wiring 91*a*, which are configured to have a long length in the present specific example, have low-pass filter characteristics by parasitic resistance and parasitic inductance.

According to the present specific example, it is possible to reduce the transfer of high frequency noise generated by the output circuit 30 to the circuit for oscillation 10 through the first wiring 91 and the second wiring 92. Similarly, it is possible to reduce the transfer of high frequency noise generated by the output circuit 30 to the circuit for oscillation 10 through the first wiring 91*a* and the second wiring 92*a*. Therefore, it is possible to realize the oscillation circuit 1 with high operation reliability.

The oscillation circuit 1 according to the present specific example further has technical meaning from the viewpoint different from the above-described technical meaning.

As illustrated in FIG. 5, the connection terminal XO is provided between the first circuit block 110 and the second circuit block 120 when seen in a plan view.

According to the present specific example, since the connection terminal XO is provided between the first circuit block 110 and the second circuit block 120 when seen in a plan view, it is possible to secure a large block of rectangular region within the second circuit block 120. Therefore, even when the semiconductor substrate 100 cannot be made large, a large region in which, for example, a circuit having one function is formed can be secured by providing a large block of rectangular region within the second circuit block 120, and thus it is possible to realize the oscillation circuit 1 with a high degree of freedom in the arrangement of a circuit.

In the present specific example, the oscillation circuit 1 has a region 111 which is inserted into the first circuit block 110 in a direction receding from the second circuit block 120 side when seen in a plan view, and at least a portion of the connection terminal XO is provided in the region 111 which is inserted into the first circuit block 110.

According to the present specific example, since the connection terminal XO is disposed so as to bite into the first circuit block 110 when seen in a plan view, a large region in which the second circuit block 120 is disposed can be secured, and thus it is possible to secure a larger block of rectangular region within the second circuit block 120. Therefore, even when the semiconductor substrate 100 cannot be made large, a large region in which, for example, a circuit having one function is formed can be secured by providing a large block of rectangular region within the second circuit block 120, and thus it is possible to realize the oscillation circuit 1 with a high degree of freedom in the arrangement of a circuit.

In the present specific example, the second circuit block 120 is provided between an outer peripheral portion 101 of the semiconductor substrate 100 and the first circuit block 110 and between the outer peripheral portion 101 and the connection terminal XO. In an example illustrated in FIG. 8, the semiconductor substrate 100 is configured as a rectangle when seen in a plan view, and the outer peripheral portion 101 is equivalent to one side of the rectangle when seen in a plan view. Meanwhile, the semiconductor substrate 100 is not required to have a completely polygonal shape when seen in a plan view, and may have a substantially polygonal shape in which irregularities are formed in the outer periphery thereof when seen in a plan view. In this case, the outer peripheral portion 101 may be equivalent to a portion that can be identified as one side of a substantially polygonal shape.

According to the present specific example, it is possible to secure a large block of rectangular region within the second circuit block 120 disposed on the outer peripheral portion 101 side of the semiconductor substrate 100, compared to a case where the connection terminal XO is provided in the vicinity of the outer peripheral portion 101 of the semiconductor substrate 100. Therefore, even when a chip size of the oscillation circuit 1 cannot be made large, a large region in which, for example, a circuit having one function is formed can be secured by providing a large block of rectangular region within the second circuit block 120, and thus it is possible to realize the oscillation circuit 1 with a high degree of freedom in the arrangement of a circuit.

In the present specific example, the second circuit block 120 is configured to include the memory 60.

According to the present specific example, the memory 60 can be disposed in a block of rectangular region within the second circuit block 120, and thus it is possible to realize the oscillation circuit 1 capable of increasing the storage capacity of the memory 60 even when the semiconductor substrate 100 cannot be made large. In addition, since the memory 60 can be disposed in a block of rectangular region, the wiring of the memory 60 is more facilitated than in a case where the memory 60 is provided in a plurality of regions. In addition, the addressing of the memory 60 is more facilitated than in a case where the memory 60 is provided in a plurality of regions.

In the present embodiment, the second circuit block 120 is provided along a long side of the semiconductor substrate 100. Thereby, it is possible to further reduce the wiring between the memory 60 of the second circuit block 120 and various circuits included in the first circuit block 110, compared to a case where the second circuit block 120 is provided along a short side of the semiconductor substrate 100.

1-2-2. Second Specific Example

Figure 6:
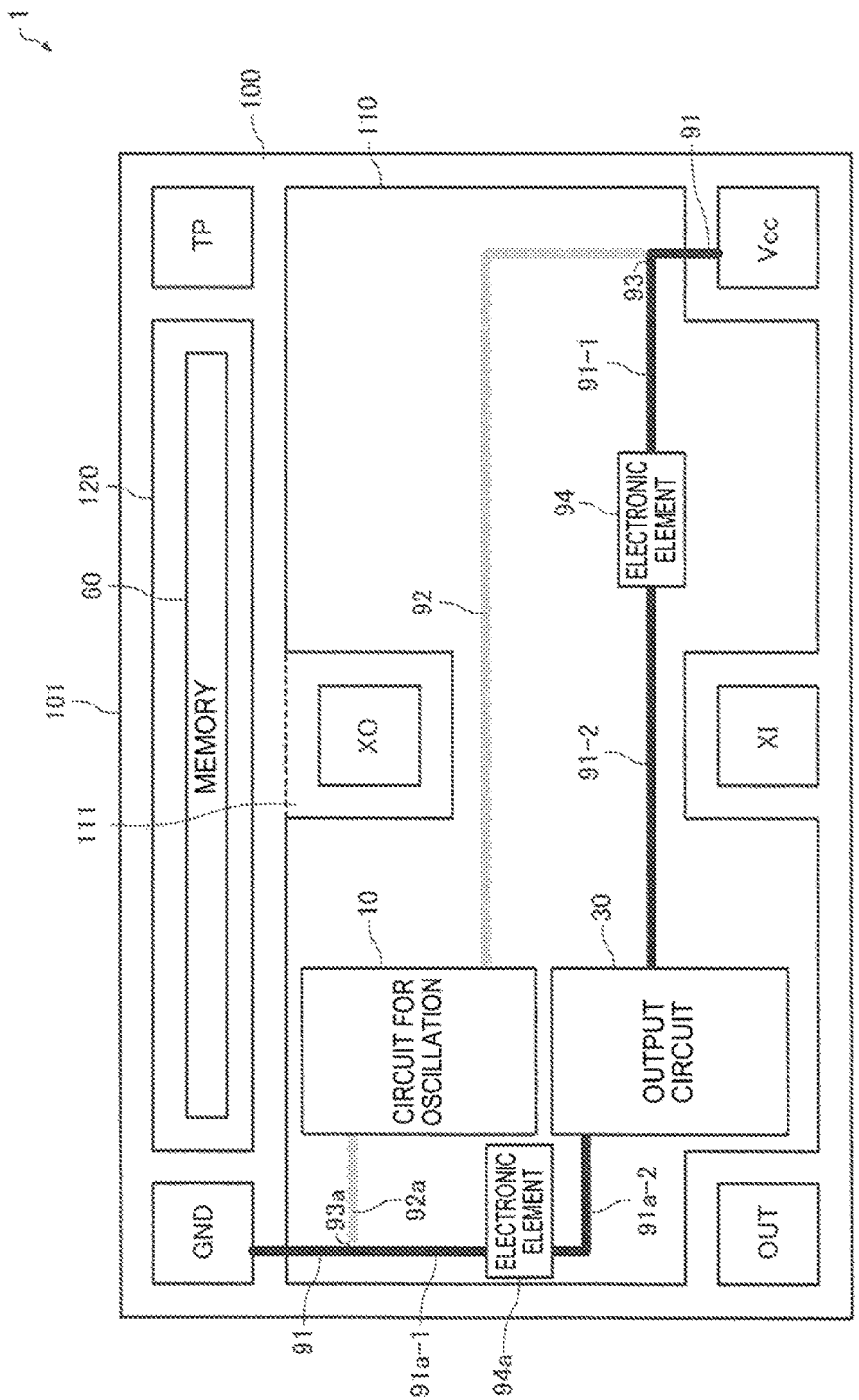
FIG. 6 is a schematic plan view illustrating a layout configuration of an oscillation circuit according to a second specific example.

FIG. 6 is a schematic plan view illustrating a layout configuration of an oscillation circuit 1 according to a second specific example. Meanwhile, in FIG. 6, some of circuits included in the oscillation circuit 1 are not described. In addition, the same components as those in the first specific example are denoted by the same reference numerals, and a detailed description thereof will be omitted.

A first wiring 91 of the oscillation circuit 1 according to this application example includes a first region 91-1 and a second region 91-2 which are separated from each other between an output circuit 30 and a connection node 93, and further includes an electronic element 94 that electrically connects the first region 91-1 and the second region 91-2. Similarly, a first wiring 91a includes a first region 91a-1 and a second region 91a-2 which are separated from each other between the output circuit 30 and a connection node 93a, and further includes an electronic element 94a that electrically connects the first region 91a-1 and the second region 91a-2. It is preferable that the electronic element 94 and the electronic element 94a have low-pass filter characteristics, and may be, for example, an inductor or a resistor.

According to the present specific example, since the first wiring 91 and the first wiring 91a are separated from each other, it is possible to reduce the transfer of heat. In addition, it is possible to radiate heat to a space through the electronic element 94 and the electronic element 94a. Therefore, it is possible to realize the oscillation circuit 1 capable of reducing a frequency fluctuation, for example, in a case where an oscillator is configured.

Also in the present specific example, the same effects are exhibited for the same reasons as those described in the first specific example.

Meanwhile, in the present embodiment and the above-described specific example, a circuit that outputs a clipped sine waveform is illustrated as the output circuit 30. However, the invention is not limited thereto, and a CMOS output circuit may be used as the output circuit 30. Since the CMOS output circuit has a heating value larger than that of a circuit that outputs a clipped sine waveform, it is possible to further exhibit effects in the above-described specific example when the CMOS output circuit is used for the output circuit 30.

2. Oscillator

Figure 7:
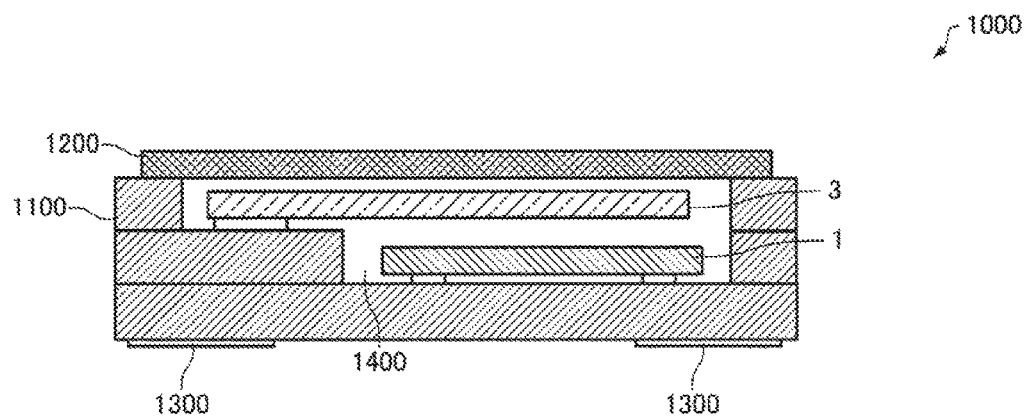
FIG. 7 is a schematic cross-sectional view illustrating an oscillator according to the present embodiment.

FIG. 7 is a schematic cross-sectional view illustrating an oscillator 1000 according to the present embodiment. The oscillator 1000 is configured to include an oscillation circuit 1, a resonator 3, and a container 1100 that accommodates the oscillation circuit 1 and the resonator 3. In an example illustrated in FIG. 7, the oscillator 1000 is configured to include the container 1100 that accommodates the oscillation circuit 1 and the resonator 3 in the same space. In addition, in the example illustrated in FIG. 7, the oscillator 1000 is configured to include a lid 1200 and an electrode 1300. In the example illustrated in FIG. 7, the oscillation circuit 1 is constituted by one chip. In addition, examples of the resonator 3 may include a quartz crystal resonator such as an AT-cut or SC-cut quartz crystal resonator which uses quartz crystal as a substrate material, a surface acoustic wave (SAW) resonator, or a micro electro mechanical systems (MEMS) resonator. In addition, examples of a substrate material of the resonator 3 include a piezoelectric material such as piezoelectric single crystal, such as quartz crystal, lithium tantalate or lithium niobate, or piezoelectric ceramics such as lead zirconate titanate, a silicon semiconductor material, and the like. As excitation means of the resonator 3, means using a piezoelectric effect may be used, or electrostatic driving using Coulomb force may be used. Meanwhile, the resonator 3 of the present embodiment is configured as a chip-shaped element having an individualized substrate material. However, the invention is not limited thereto, and a resonation device in which a chip-shaped element is sealed in a container may be used.

A concave portion is provided in the container 1100 and is covered with the lid 1200 to thereby configure an accommodation chamber 1400. In the container 1100, a wiring and a terminal that electrically connect the oscillation circuit 1 and the resonator 3 are provided on the surface of the concave portion or inside the container 1100. In addition, the container 1100 is provided with the electrode 1300 which is electrically connected to at least a connection terminal Vcc, a connection terminal GND, a connection terminal OUT, and a connection terminal TP of the oscillation circuit 1.

Figure 8:
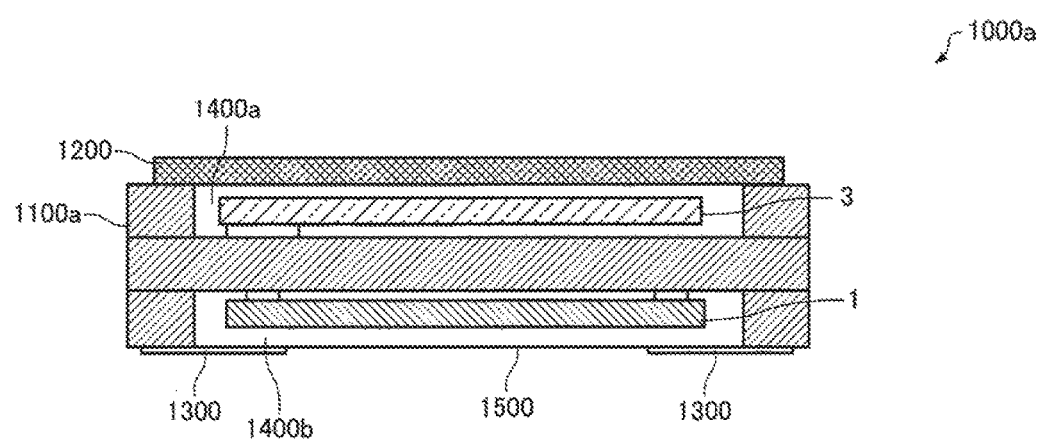
FIG. 8 is a schematic cross-sectional view illustrating an oscillator according to a modification example.

FIG. 8 is a schematic cross-sectional view illustrating an oscillator 1000a according to a modification example. The oscillator 1000a is configured to include an oscillation circuit 1, a resonator 3, and a container 1100a that accommodates the oscillation circuit 1 and the resonator 3. In an example illustrated in FIG. 8, the oscillator 1000a is configured to include the container 1100a that accommodates the oscillation circuit 1 and the resonator 3 in different spaces. In addition, in the example illustrated in FIG. 8, the oscillator 1000a is configured to include a lid 1200, an electrode 1300, and a sealing member 1500. In the example illustrated in FIG. 8, the oscillation circuit 11 is constituted by one chip. In addition, examples of the resonator 3 may include a quartz crystal resonator such as an AT-cut or SC-cut quartz crystal resonator which uses quartz crystal as a substrate material, a surface acoustic wave (SAW) resonator, or a micro electro mechanical systems (MEMS) resonator. In addition, examples of a substrate material of the resonator 3 include a piezoelectric material such as piezoelectric single crystal, such as quartz crystal, lithium tantalate or lithium niobate, or piezoelectric ceramics such as lead zirconate titanate, a silicon semiconductor material, and the like. As excitation means of the resonator 3, means using a piezoelectric effect may be used, or electrostatic driving using Coulomb force may be used. Meanwhile, the resonator 3 of the present modification example is configured as a chip-shaped element having an individualized substrate material. However, the invention is not limited thereto, and a resonation device in which a chip-shaped element is sealed in a container may be used.

The container 1100a is provided with two concave portions on opposite surfaces. One of the concave portions is covered with the lid 1200 to thereby configure an accommodation chamber 1400a, and the other is covered with the sealing member 1500 to thereby configure an accommodation chamber 1400b. In the example illustrated in FIG. 8, the resonator 3 is accommodated in the accommodation chamber 1400a, and the oscillation circuit 1 is accommodated in the accommodation chamber 1400b. In the container 1100a, a wiring and a terminal for electrically connecting the oscillation circuit 1 and the resonator 3 are provided on the surface of the concave portion or inside the container 1100a. In addition, the container 1100a is provided with the electrode 1300 which is electrically connected to at least a connection terminal Vcc, a connection terminal GND, a connection terminal OUT, and a connection terminal TP of the oscillation circuit 1.

According to the oscillator 1000 and the oscillator 1000a of the present embodiment, heat generated by an output circuit 30 is radiated to the outside through a first wiring 91 and the connection terminal Vcc, and thus it is possible to reduce the transfer of heat to a circuit for oscillation 10 through the first wiring 91 and a second wiring 92. Similarly, heat generated by the output circuit 30 is radiated to the outside through a first wiring 91a and the connection terminal GND, and thus it is possible to reduce the transfer of heat to the circuit for oscillation 10 through the first wiring 91a and a second wiring 92a. Therefore, it is possible to realize the oscillator 1000 and the oscillator 1000a which are capable of reducing a frequency fluctuation.

3. Electronic Apparatus

Figure 9:
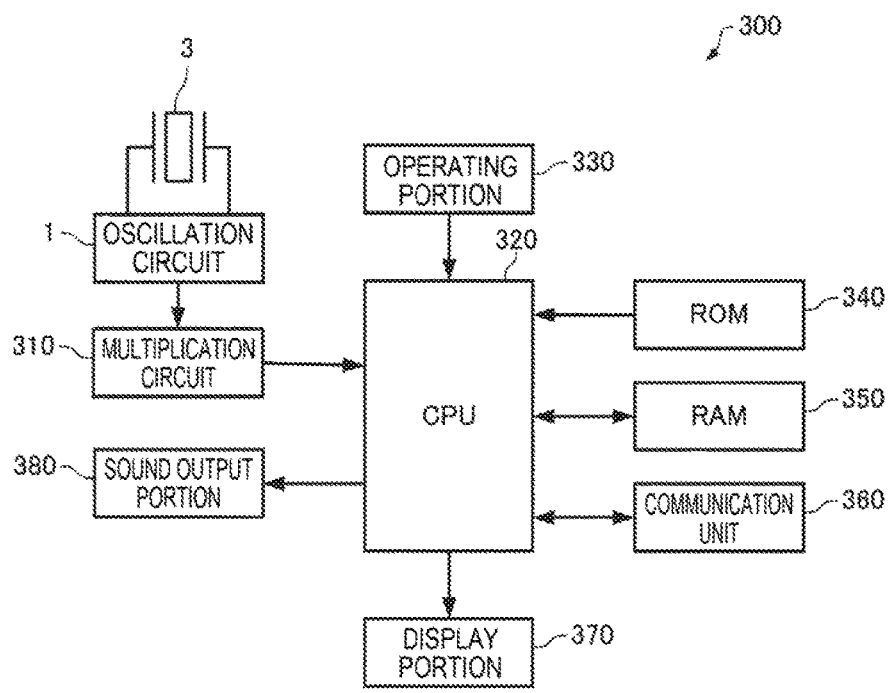
FIG. 9 is a functional block diagram of an electronic apparatus according to the present embodiment.

FIG. 9 is a functional block diagram of an electronic apparatus 300 according to the present embodiment. Meanwhile, the same components as those in the above-described embodiments are denoted by the same reference numerals, and a detailed description thereof will be omitted.

Figure 11:
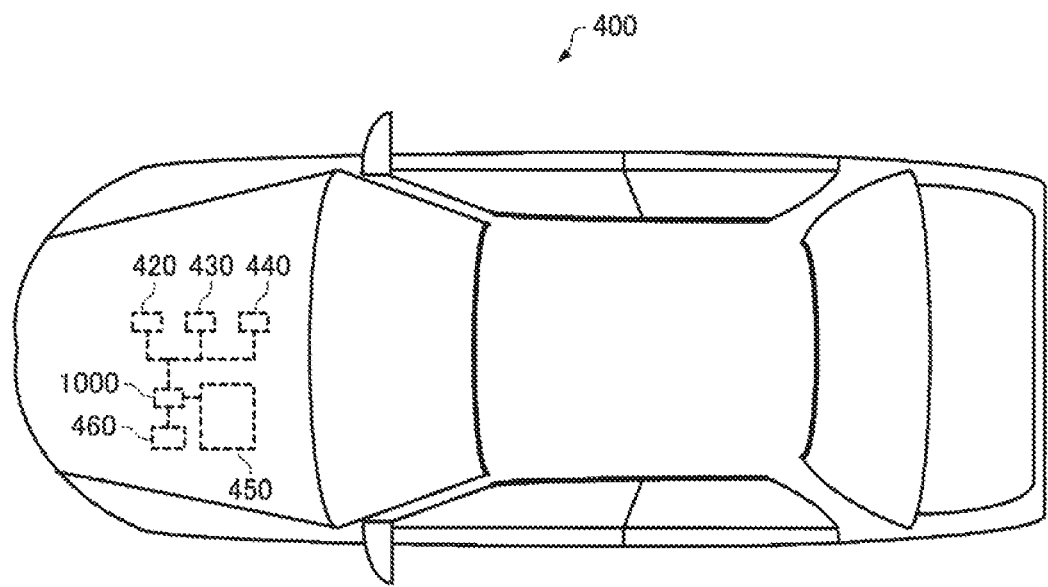
FIG. 11 is a diagram (top view) illustrating an example of a moving object according to the present embodiment.

The electronic apparatus 300 according to the present embodiment is an electronic apparatus 300 including an oscillation circuit 1. In an example illustrated in FIG. 9, the electronic apparatus 300 is configured to include a resonator 3, the oscillation circuit 1, a multiplication circuit 310, a central processing unit (CPU) 320, an operating portion 330, a read only memory (ROM) 340, a random access memory (RAM) 350, a communication unit 360, a display portion 370, and a sound output portion 380. Meanwhile, the electronic apparatus 300 according to the present embodiment may have a configuration in which some of components (respective portions) illustrated in FIG. 11 are omitted or changed, or may have a configuration in which other components are added.

The multiplication circuit 310 supplies a clock pulse not only to the CPU 320 but also to each unit (not shown). The clock pulse may be, for example, a signal obtained by extracting a desired harmonic signal from an oscillation signal applied from the oscillation circuit 1 which is connected to the resonator 3 by the multiplication circuit 310, or may be a signal obtained by multiplying an oscillation signal from the oscillation circuit 1 by the multiplication circuit 310 including a PLL synthesizer (not shown).

The CPU 320 performs various types of computation processes and control processes using a clock pulse which is output by the multiplication circuit 310, in accordance with a program stored in the ROM 340 or the like. Specifically, the CPU 320 performs various types of processes in response to an operation signal from the operating portion 330, a process of controlling the communication unit 360 in order to perform data communication with the outside, a process of transmitting a display signal for causing the display portion 370 to display a variety of information, a process of causing the sound output portion 380 to output various types of sounds, and the like.

The operating portion 330 is an input device constituted by operation keys, button switches or the like, and outputs an operation signal in response to a user's operation to the CPU 320.

The ROM 340 stores programs, data or the like for causing the CPU 320 to perform various types of computation processes and control processes.

The RAM 350 is used as a work area of the CPU 320, and temporarily stores programs and data which are read out from the ROM 340, data which is input from the operating portion 330, arithmetic operation results executed by the CPU 320 in accordance with various types of programs, and the like.

The communication unit 360 performs a variety of control for establishing data communication between the CPU 320 and an external device.

The display portion 370 is a display device constituted by a liquid crystal display (LCD), an electrophoretic display or the like, and displays a variety of information on the basis of a display signal which is input from the CPU 320.

The sound output portion 380 is a device that outputs a sound of a speaker or the like.

According to the electronic apparatus 300 of the present embodiment, the oscillation circuit 1 capable of reducing a frequency fluctuation is used in a case where an oscillator is configured, and thus it is possible to realize the electronic apparatus 300 with high reliability.

Various electronic apparatuses are considered as the electronic apparatus 300. Examples of the electronic apparatus include a personal computer (for example, mobile-type personal computer, laptop personal computer, or tablet personal computer), a mobile terminal such as a cellular phone, a digital still camera, an ink jet ejecting apparatus (for example, ink jet printer), a storage area network device such as a router or a switch, a local area network device, a device for a base station of a mobile terminal, a television, a video camera, a video tape recorder, a car navigation device, a pager, an electronic notebook (also including a communication function), an electronic dictionary, an electronic calculator, an electronic game console, a game controller, a word processor, a workstation, a TV phone, a security TV monitor, electronic binoculars, a point of sale (POS) terminal, a medical instrument (for example, electronic thermometer, sphygmomanometer, blood glucose monitoring system, electrocardiogram measurement device, ultrasound diagnostic device, and electronic endoscope), a fish detector, various types of measuring apparatus, meters and gauges (for example, meters and gauges of a vehicle, an aircraft, and a vessel), a wattmeter, a flight simulator, a head mounted display, a motion tracer, a motion tracker, a motion controller, PDR (walker position and direction measurement), and the like.

Figure 10:
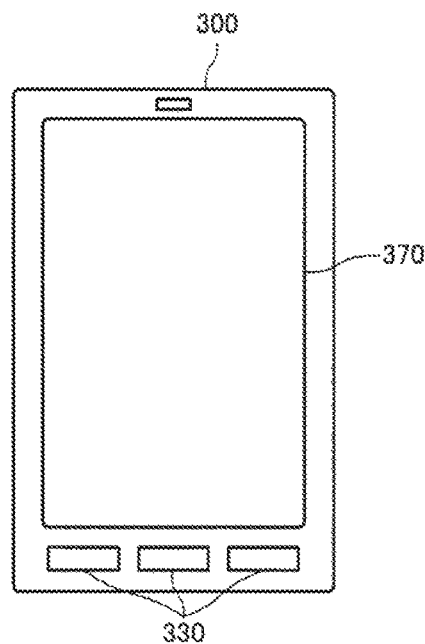
FIG. 10 is a diagram illustrating an example of the exterior of a smartphone which is an example of the electronic apparatus.

FIG. 10 is a diagram illustrating an example of the exterior of a smartphone which is an example of the electronic apparatus 300. A smartphone which is the electronic apparatus 300 includes buttons as the operating portions 330 and an LCD as the display portion 370. The smartphone which is the electronic apparatus 300 uses the oscillation circuit 1 capable of reducing a frequency fluctuation in a case where an oscillator is configured, and thus it is possible to realize the electronic apparatus 300 with high reliability.

4. Moving Object

FIG. 11 is a diagram (top view) illustrating an example of a moving object 400 according to the present embodiment. Meanwhile, the same components as those in the above-described embodiments are denoted by the same reference numerals, and a detailed description thereof will be omitted.

The moving object 400 according to the present embodiment is a moving object including an oscillator 1000 using an oscillation circuit 1. In FIG. 11, the moving object 400 including the oscillator 1000 is illustrated. In addition, in the example illustrated in FIG. 11, the moving object 400 is configured to include controllers 420, 430, and 440 that perform a variety of control of an engine system, a brake system, a keyless entry system and the like, a battery 450, and a battery 460 for backup. Meanwhile, the moving object 400 according to the present embodiment may have a configuration in which some of components (respective portions) illustrated in FIG. 11 are omitted or changed, or may have a configuration in which other components are added.

According to the moving object 400 of the present embodiment, the oscillation circuit 1 capable of reducing a frequency fluctuation is used in a case where an oscillator is configured, and thus it is possible to realize the moving object 400 with high reliability.

Various moving objects are considered as the moving object 400. Examples of the moving object include an automobile (also including an electric automobile), an aircraft such as a jet engine airplane or a helicopter, a vessel, a rocket, a satellite, and the like.

The invention is not limited to the present embodiment, and various changes and modifications can be made without departing from the scope of the invention.

For example, in the above-described embodiments, an oscillator (TCXO) including a temperature compensation circuit as a characteristic adjusting circuit has been illustrated. However, the invention can also be applied to various oscillators such as an oscillator (SPXO or the like) which includes a frequency adjustment circuit as a characteristic adjusting circuit and an oscillator (VCXO, VC-TCXO, or the like) which includes an auto frequency control (AFC) circuit as a characteristic adjusting circuit.

Each of the above-described embodiments and modification example is an example, and is not limited thereto. For example, the embodiments and the modification example can also be appropriately combined.

The invention includes configurations (for example, configurations having the same functions, methods and results, or configurations having the same objects and effects) which are substantially the same as the configurations described in the above embodiments. In addition, the invention includes configurations in which non-essential elements of the configurations described in the embodiments are replaced. In addition, the invention includes configurations exhibiting the same operations and effects as, or configurations capable of achieving the same objects as, the configurations described in the embodiments. In addition, the invention includes configurations in which known techniques are added to the configurations described in the embodiments.

The entire disclosure of Japanese Patent Application No. 2015-027769, filed Feb. 16, 2015 is expressly incorporated by reference herein.

What is claimed is:

1. An oscillation circuit comprising:
a circuit for oscillation that is connected to a resonator and oscillates the resonator;
an output circuit that has a signal, output from the circuit for oscillation, input thereto to thereby output an oscillation signal;
a pad to which power is applied;
a first wiring that connects from the pad to the output circuit; and
a second wiring that is connected to the first wiring at a connection node provided on the first wiring, the second wiring extending from the connection node to the circuit for oscillation,
the connection node being disposed at an intersection of the second wiring, a first portion of the first wiring extending from the connection node to the output circuit, and a second portion of the first wiring extending from the connection node to the pad, wherein
the circuit for oscillation, the output circuit, the pad, the first wiring, and the second wiring are provided on a semiconductor substrate,
a length of the second portion of the first wiring is shorter than a length of the second wiring, the length of the second portion of the first wiring is shorter than a length of the first portion of the first wiring, and the length of the second wiring from the connection node to the circuit for oscillation is longer than a length of the first wiring from the pad to the output circuit.

2. The oscillation circuit according to claim 1, wherein the first wiring has low-pass filter characteristics.

3. The oscillation circuit according to claim 2, wherein the first wiring has a first region and a second region which are separated from each other between the output circuit and the connection node, and
wherein the oscillation circuit further comprises an electronic element that electrically connects the first region and the second region.

4. An oscillator comprising:
the oscillation circuit according to claim 1;
the resonator; and
a container that accommodates the oscillation circuit and the resonator.

5. An oscillator comprising:
the oscillation circuit according to claim 2;
the resonator; and
a container that accommodates the oscillation circuit and the resonator.

6. An oscillator comprising:
the oscillation circuit according to claim 3;
the resonator; and
a container that accommodates the oscillation circuit and the resonator.

7. An electronic apparatus comprising the oscillation circuit according to claim 1.

8. An electronic apparatus comprising the oscillation circuit according to claim 2.

9. An electronic apparatus comprising the oscillation circuit according to claim 3.

10. A moving object comprising the oscillation circuit according to claim 1.

11. A moving object comprising the oscillation circuit according to claim 2.

12. A moving object comprising the oscillation circuit according to claim 3.

13. The oscillation circuit according to claim 1, wherein the output circuit includes a heating unit configured such that a direct current to be input is controlled based on operation states of the circuit for oscillation.

\* \* \* \* \*